(12) United States Patent
Huo et al.

(10) Patent No.: US 10,756,102 B2
(45) Date of Patent: Aug. 25, 2020

(54) THREE-DIMENSIONAL MEMORY STRUCTURE AND MANUFACTURING METHOD THEREOF

(71) Applicant: Yangtze Memory Technologies Co., Ltd., Wuhan, Hubei Province (CN)

(72) Inventors: Zongliang Huo, Wuhan (CN); Deqin Yu, Wuhan (CN); Wenbin Zhou, Wuhan (CN); Yong Hui Gao, Wuhan (CN)

(73) Assignee: Yangtze Memory Technologies Co., Ltd., Wuhan, Hubei Province (CN)

( * ) Notice: Subject to any disclaimer, the term of this patent is extended or adjusted under 35 U.S.C. 154(b) by 0 days.

(21) Appl. No.: 16/149,155

(22) Filed: Oct. 2, 2018

(65) Prior Publication Data

US 2019/0157287 A1 May 23, 2019

Related U.S. Application Data

(63) Continuation of application No. PCT/CN2018/106998, filed on Sep. 21, 2018.

(30) Foreign Application Priority Data

Nov. 23, 2017 (CN) .......................... 2017 1 1185087

(51) Int. Cl.
*H01L 27/11573* (2017.01)
*H01L 27/12* (2006.01)
*H01L 27/11524* (2017.01)
*H01L 27/11529* (2017.01)
*H01L 27/1157* (2017.01)
*H01L 27/11556* (2017.01)
*H01L 27/11575* (2017.01)
*H01L 27/11582* (2017.01)

(52) U.S. Cl.
CPC .... *H01L 27/11573* (2013.01); *H01L 27/1157* (2013.01); *H01L 27/11524* (2013.01);
(Continued)

(58) Field of Classification Search
CPC ......... H01L 27/11573; H01L 27/11524; H01L 27/11529; H01L 27/11556; H01L 27/1157;
(Continued)

(56) References Cited

U.S. PATENT DOCUMENTS

| 8,008,732 B2 | 8/2011 | Kiyotoshi |
| 2006/0076611 A1* | 4/2006 | Matsui .................. H01L 27/105 257/316 |

(Continued)

FOREIGN PATENT DOCUMENTS

| CN | 102097435 A | 6/2011 |
| CN | 102800676 A | 11/2012 |

(Continued)

*Primary Examiner* — Dzung Tran
(74) *Attorney, Agent, or Firm* — Winston Hsu

(57) ABSTRACT

A three-dimensional (3D) memory structure and a manufacturing method thereof are provided. The method includes the following steps. A 3D memory unit is formed on a first region of a substrate. A first insulation layer is formed on the first region and a second region of the substrate. A first planarization process is performed to the first insulation layer. The top surface of the first insulation layer on the first region and the top surface of the first insulation layer on the second region are coplanar after the first planarization process. A peripheral circuit is formed on the second region after the first planarization process. The influence of the process for forming the 3D memory unit on the peripheral circuit may be avoided. The manufacturing yield, the electrical performance, and the reliability of the 3D memory structure may be enhanced accordingly.

9 Claims, 12 Drawing Sheets

(52) U.S. Cl.
CPC .. *H01L 27/11529* (2013.01); *H01L 27/11556* (2013.01); *H01L 27/11575* (2013.01); *H01L 27/1207* (2013.01); *H01L 27/11582* (2013.01)

(58) Field of Classification Search
CPC ........... H01L 27/11575; H01L 27/1207; H01L 27/11582
USPC ........................................................ 257/314
See application file for complete search history.

(56) References Cited

U.S. PATENT DOCUMENTS

| | | | |
|---|---|---|---|
| 2007/0047371 A1* | 3/2007 | Park | ........................ G11C 11/412 365/230.06 |
| 2009/0212350 A1* | 8/2009 | Kidoh | ................. H01L 27/0688 257/324 |
| 2012/0299082 A1 | 11/2012 | Park | |
| 2014/0061849 A1 | 3/2014 | Tanzawa | |
| 2014/0131786 A1* | 5/2014 | Ryu | ................... H01L 27/10894 257/316 |
| 2015/0255386 A1* | 9/2015 | Lee | ................... H01L 27/11582 257/774 |
| 2016/0027796 A1* | 1/2016 | Yang | ................. H01L 27/11573 257/314 |
| 2016/0240555 A1 | 8/2016 | Lee | |
| 2017/0133266 A1* | 5/2017 | Kim | ................. H01L 21/31144 |
| 2017/0148812 A1 | 5/2017 | Hsu | |
| 2017/0271351 A1 | 9/2017 | Lee | |

FOREIGN PATENT DOCUMENTS

| | | |
|---|---|---|
| CN | 103811554 A | 5/2014 |
| TW | 201133795 A1 | 10/2011 |

* cited by examiner

THREE-DIMENSIONAL MEMORY STRUCTURE AND MANUFACTURING METHOD THEREOF

CROSS REFERENCE TO RELATED APPLICATIONS

This application is a continuation of International Application No. PCT/CN2018/106998, filed Sep. 21, 2018, which is incorporated by reference herein in its entirety.

BACKGROUND OF THE INVENTION

1. Field of the Invention

The present disclosure relates to a three-dimensional (3D) memory structure and a manufacturing method thereof, and more particularly, to a 3D memory structure including a 3D memory unit and a peripheral circuit and a manufacturing method thereof.

2. Description of the Prior Art

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array. Please refer to FIG. 1. FIG. 1 is a schematic drawing illustrating a conventional 3D memory structure. As shown in FIG. 1, a 3D memory unit 930 and a peripheral circuit 920 are disposed on a substrate 910. The structure of the 3D memory unit 930 is different from the structure of the peripheral circuit 920, and they have to be manufactured separately. Generally, the peripheral circuit 920 is formed on the substrate 910 before the step of forming the 3D memory unit 930. However, there are some problems induced by this process sequence. For example, when thermal treatments and/or thermal processes are required for forming the 3D memory unit 930, the electrical performance of the peripheral circuit 920 will be affected by the thermal treatments and/or the thermal processes, and the manufacturing yield may be decreased accordingly. Additionally, materials, such as hydrogen or other plasma and/or gases used in the processes for forming the 3D memory unit 930 may be diffused into the peripheral circuit 920, and the reliability of the 3D memory structure may be influenced accordingly. In addition, when the bottom of the peripheral circuit 920 and the bottom of the 3D memory unit 930 are substantially disposed at the same level above the substrate 910, the height difference between the bottom of the peripheral circuit 920 and the bottom of the 3D memory unit 930 will be significant because of the structural and process differences, and it will be more difficult to form interconnection structures because the aspect ratio of some contact holes is too high.

SUMMARY OF THE INVENTION

A three-dimensional (3D) memory structure and a manufacturing method thereof are provided in the present disclosure. A peripheral circuit is formed on a substrate after forming a 3D memory unit on the substrate, forming a first insulation layer on the substrate and the 3D memory unit, and planarizing the first insulation layer. Therefore, influence of processes for forming the 3D memory unit, such as influence of a thermal treatment, plasma, and/or gases used in the processes, on the peripheral circuit may be avoided. The manufacturing yield, the electrical performance, and the reliability of the 3D memory structure may be enhanced accordingly.

According to an embodiment of the present disclosure, a manufacturing method of a 3D memory structure is provided. The manufacturing method includes the following steps. A substrate is provided, and a first region and a second region are defined on the substrate. A 3D memory unit is formed on the first region of the substrate. A first insulation layer is formed on the substrate after forming the 3D memory unit. The first insulation layer is formed on the first region and the second region of the substrate. A first planarization process is performed to the first insulation layer. The top surface of the first insulation layer on the first region and the top surface of the first insulation layer on the second region are coplanar after the first planarization process. A peripheral circuit is formed on the second region after the first planarization process.

In some embodiments, the step of forming the peripheral circuit on the second region includes forming a semiconductor layer on the first insulation layer above the second region, wherein the peripheral circuit is formed on the semiconductor layer.

In some embodiments, the step of forming the peripheral circuit on the second region further includes forming a recess in the first insulation layer above the second region, wherein the semiconductor layer is formed in the recess.

In some embodiments, the step of forming the peripheral circuit on the second region further includes forming an insulation film in the recess before forming the semiconductor layer, wherein the semiconductor layer is formed on the insulation film in the recess.

In some embodiments, the top surface of the semiconductor layer above the second region is higher than or coplanar with the top surface of the first insulation layer above the first region.

In some embodiments, the semiconductor layer includes a silicon semiconductor layer, and the semiconductor layer and a part of the first insulation layer above the second region form a silicon-on-insulator (SOI) structure.

In some embodiments, the manufacturing method further includes forming a field oxide layer on the substrate before forming the 3D memory unit, wherein the field oxide layer is formed on the first region and the second region; and removing the field oxide layer on the first region before forming the 3D memory unit.

In some embodiments, the manufacturing method further includes forming a second insulation layer on the substrate after forming the peripheral circuit, wherein the second insulation layer is formed on the first region and the second region; and forming an interconnection structure between the 3D memory unit and the peripheral circuit, wherein the interconnection structure is partly formed in the second insulation layer and partly formed on the insulation layer.

In some embodiments, the manufacturing method further includes performing a second planarization process to the second insulation layer before forming the interconnection structure.

In some embodiments, the first region includes a core device region, and the second region includes a peripheral circuit region.

According to an embodiment of the present disclosure, a 3D memory structure is provided. The 3D memory structure includes a substrate, a 3D memory unit, a first insulation layer, and a peripheral circuit. A first region and a second region are defined on the substrate. The 3D memory unit is disposed on the first region of the substrate. The first insulation layer is disposed on the 3D memory unit and the second region of the substrate. The peripheral circuit is disposed on the first insulation layer above the second region.

In some embodiments, the 3D memory structure further includes a semiconductor layer disposed on the first insulation layer above the second region, wherein the peripheral circuit is disposed on the semiconductor layer.

In some embodiments, the 3D memory structure further includes a recess disposed in the first insulation layer above the second region, wherein the semiconductor layer is disposed in the recess.

In some embodiments, the 3D memory structure further includes an insulation film disposed in the recess, wherein the semiconductor layer is disposed on the insulation film in the recess.

In some embodiments, the top surface of the semiconductor layer above the second region is higher than or coplanar with the top surface of the first insulation layer above the first region.

In some embodiments, the semiconductor layer includes a silicon semiconductor layer, and the semiconductor layer and a part of the first insulation layer above the second region form a silicon-on-insulator (SOI) structure.

In some embodiments, the 3D memory unit includes a 3D NAND memory unit, a 3D NOR memory unit, a DRAM unit, or a 3D XPoint memory unit.

According to an embodiment of the present disclosure, a 3D memory device including the 3D memory structure is provided.

According to an embodiment of the present disclosure, an electronic device including the 3D memory device is provided.

Other aspects of the present disclosure can be understood by those skilled in the art in light of the description, the claims, and the drawings of the present disclosure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIGS. 3-11 are schematic drawings illustrating the manufacturing method of the 3D memory structure according to the first embodiment of the present disclosure, wherein FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, FIG. 9 is a schematic drawing in a step subsequent to FIG. 8, FIG. 10 is a schematic drawing in a step subsequent to FIG. 9, and FIG. 11 is a schematic drawing in a step subsequent to FIG. 10.

Figure 1:
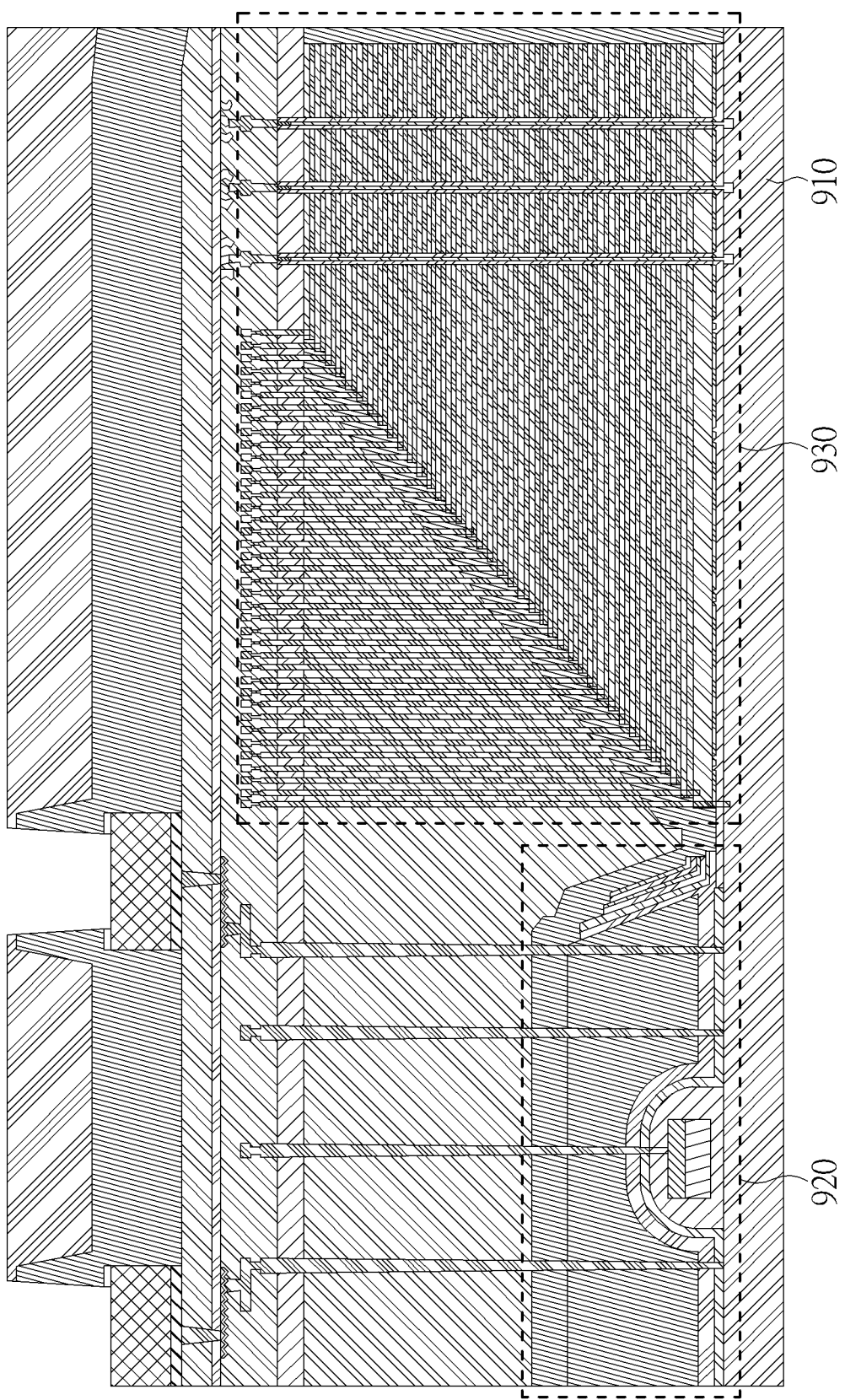
FIG. 1 is a schematic drawing illustrating a conventional 3D memory structure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances.

Figure 2:
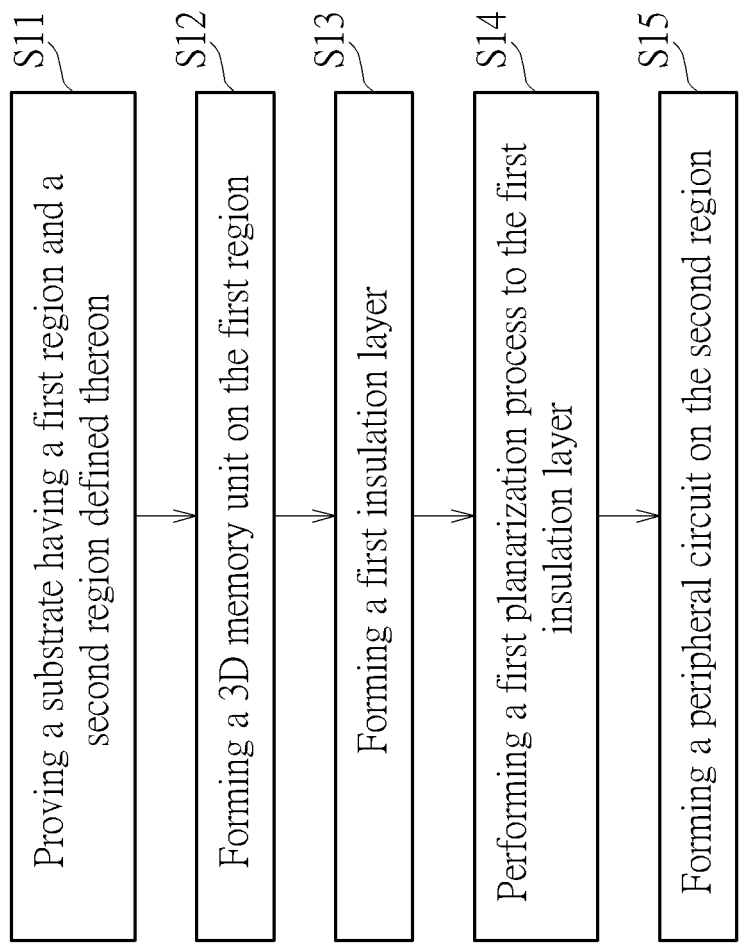
FIG. 2 is a flowchart of a manufacturing method of a 3D memory structure according to a first embodiment of the present disclosure.
Figure 9:
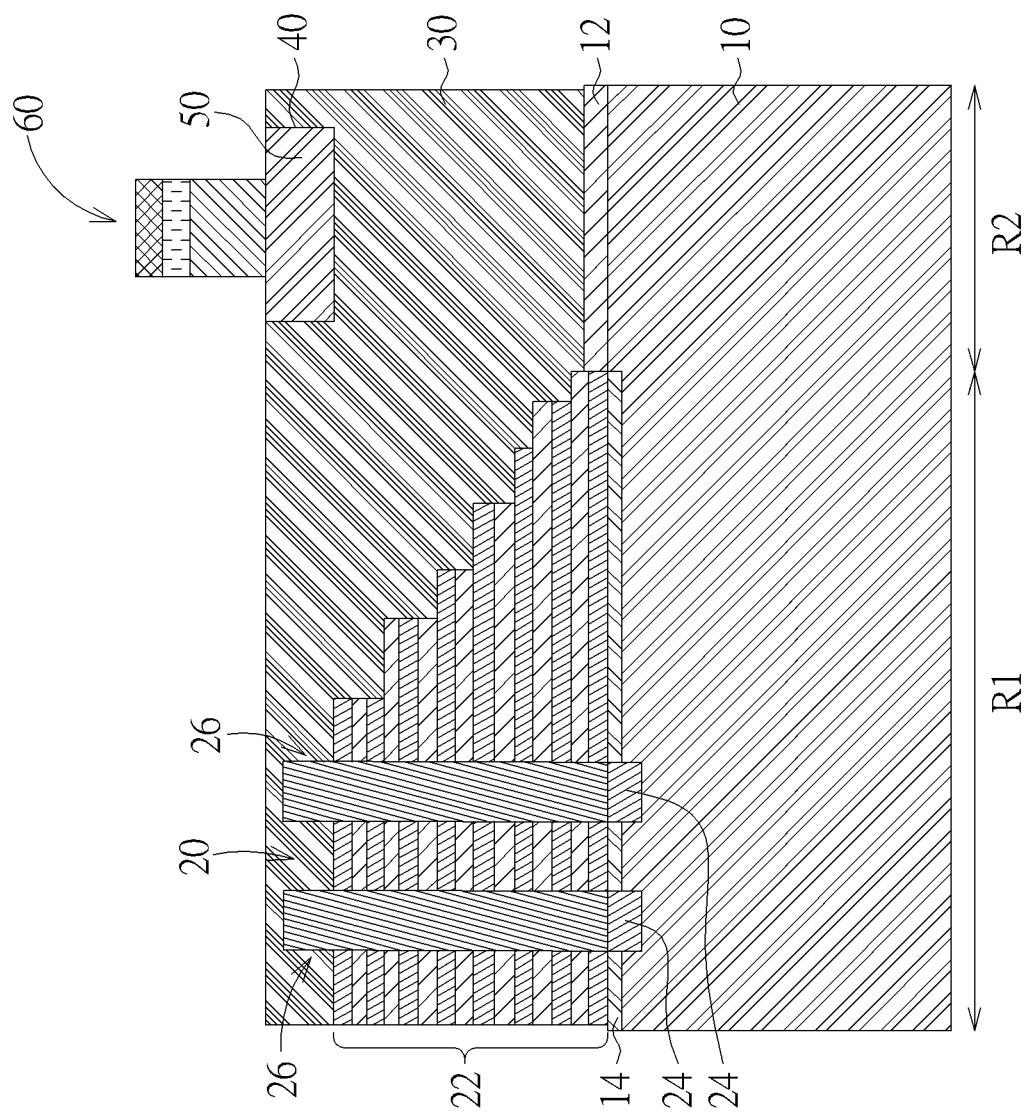
Figure 10:
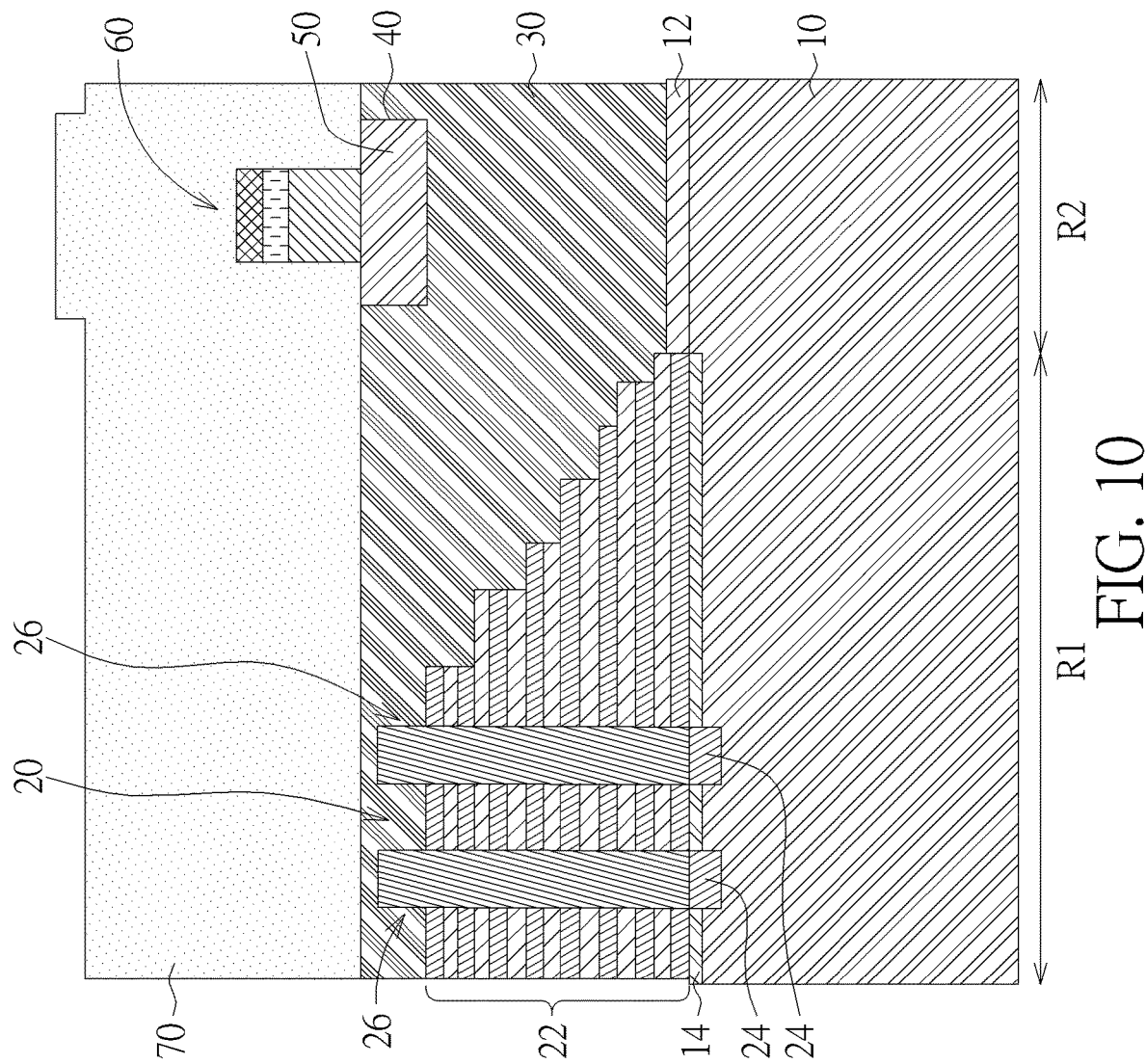
Figure 11:
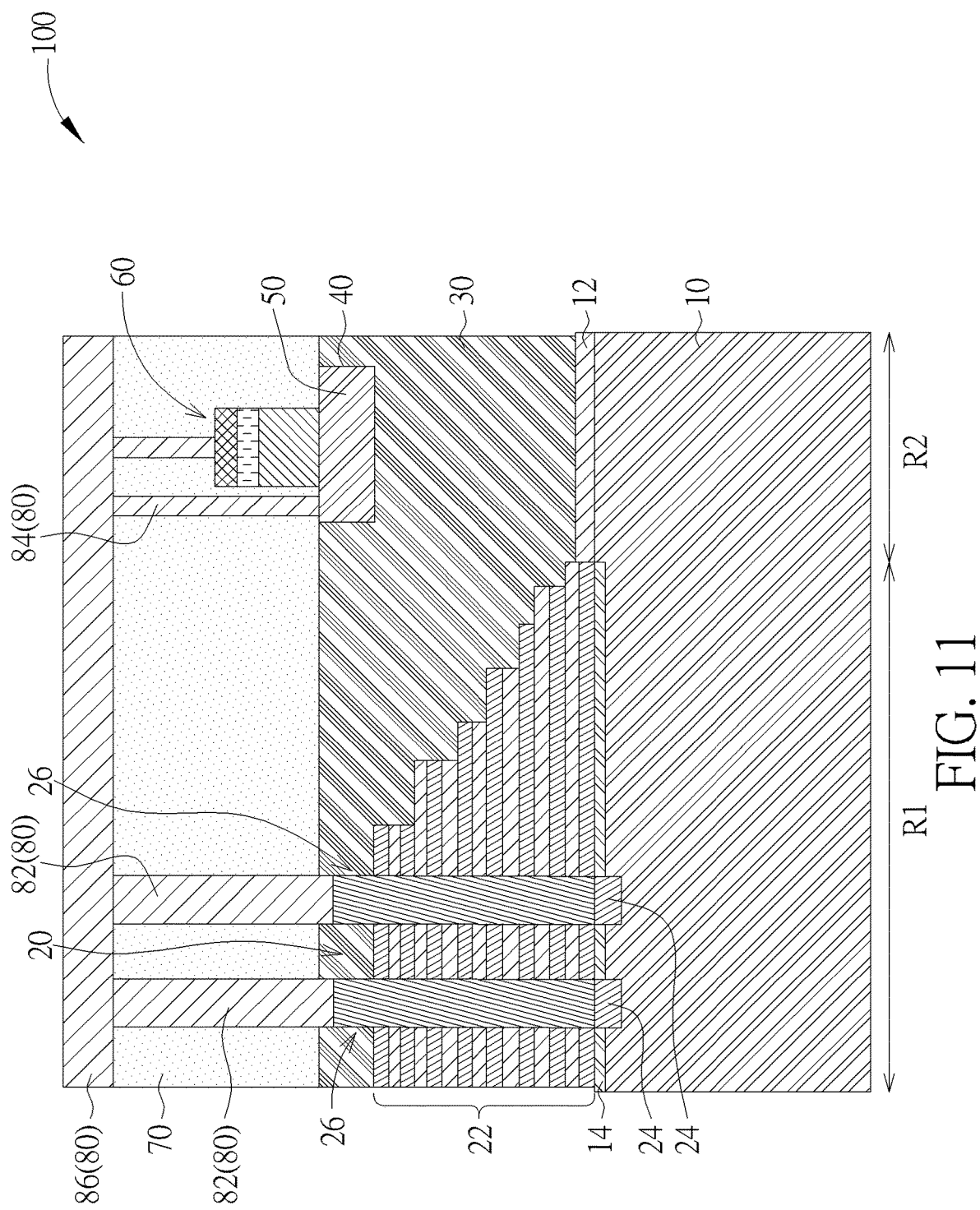

Please refer to FIGS. 2-11. FIG. 2 is a flowchart of a manufacturing method of a 3D memory structure according to a first embodiment of the present disclosure. FIGS. 3-11 are schematic drawings illustrating the manufacturing method of the 3D memory structure in this embodiment. As shown in FIG. 2 and FIG. 11, a manufacturing method of a 3D memory structure is provided. The manufacturing method includes the following steps. In step S11, a substrate 10 is provided. The substrate 10 may have a first region R1 and a second region R2 defined thereon. In some embodiments, the first region R1 may include a core device region for forming memory units and/or other required components, and the second region R2 may include a peripheral circuit region for forming peripheral circuits, but not limited thereto. In some embodiments, the second region R2 may include a region for forming other required peripheral active and/or passive components. In some embodiments, the substrate 10 may include silicon (e.g., monocrystalline silicon, polycrystalline silicon), silicon germanium (SiGe), silicon carbide (SiC), gallium nitride (GaN), indium phosphide (InP), gallium arsenide (GaAs), germanium (Ge), silicon on insulator (SOI), germanium on insulator (GOI), or any suitable combination thereof. Subsequently, in step S12, a 3D memory unit 20 is formed on the first region R1 of the substrate 10. In some embodiments, the 3D memory unit 20 may include a 3D NAND memory unit, a 3D NOR memory unit, a dynamic random access memory (DRAM) unit, a 3D XPoint memory unit, or other suitable 3D memory units. The 3D NAND memory unit described above may include a bit cost scalable (BiCS) NAND unit, a terabit cell array transistor (TCAT) NAND unit, or other suitable 3D NAND memory designs. Therefore, the processes of forming the 3D memory unit 20 may vary in accordance with the different types of the 3D memory unit 20 and are not limited in the present disclosure.

In step S13, a first insulation layer 30 is formed after the step of forming the 3D memory unit 20. The first insulation layer 30 is formed on the first region R1 and the second region R2 of the substrate 10. In some embodiments, the first insulation layer 30 may be a single layer structure or a multiple layer structure of insulation materials, such as silicon oxide, silicon nitride, silicon oxynitride, silicon carbonitride, tetra-ethyl-ortho-silicate (TEOS), any suitable combination thereof, or other suitable insulation materials. The first insulation layer 30 may be formed by deposition processes, such as atomic layer deposition (ALD), chemical vapor deposition (CVD), physical vapor deposition (PVD), a combination thereof, or other suitable film forming processes. In some embodiments, at least apart of the 3D memory unit 20 formed on the first region R1 is covered by the first insulation layer 30.

Subsequently, in step S14, a first planarization process may be performed to the first insulation layer 30. In some embodiments, the top surface of the first insulation layer 30 may be uneven before the first planarization process because of the 3D memory unit 20 formed on the first region R1, and the first planarization process may be used to reduce the height difference between the first insulation layer 30 above the first region R1 and the first insulation layer 30 above the second region R2. In some embodiments, the top surface of the first insulation layer 30 on the first region R1 and the top surface of the first insulation layer 30 on the second region R1 may be nominally coplanar after the first planarization process. In some embodiments, the first planarization process may include a chemical mechanical polishing (CMP) process, an etching back process, or other suitable planarization approaches.

Subsequently, in step S15, a peripheral circuit 60 is formed on the second region R2 after the first planarization process. The peripheral circuit 60 may be formed on the first insulation layer 30 above the second region R2 after the first planarization process. In some embodiments, the peripheral circuit 60 may include one or more of a page buffer, a decoder (e.g., a row decoder and a column decoder), a driver, a charge pump, a current or voltage reference, or any active or passive components required in the circuits (e.g., transistors, diodes, resistors, or capacitors). In some embodiments, the peripheral circuit 60 may be formed by CMOS technology, but not limited thereto. For example, in some embodiments, the processes of forming the peripheral circuit 60 may include forming a P well and an N well in a high voltage region, forming an oxide layer on the high voltage region, forming a shallow trench isolation (STI), forming a P well and an N well in a low voltage region, forming an oxide layer on the low voltage region, forming polysilicon gate structures, forming tungsten silicide, forming source/drain regions, and forming a silicon oxide protection layer, but not limited thereto.

The height difference between the peripheral circuit 60 above the second region R2 and the 3D memory unit 20 above the first region R1 may be reduced by the first planarization process described above especially when the 3D memory unit 20 is much higher than the peripheral circuit 60 in a vertical direction perpendicular to the surface of the substrate 10. By performing the first planarization process to the first insulation layer 30 before forming the peripheral circuit 60, the peripheral circuit 60 and the 3D memory unit 20 may be formed on different levels above the substrate 10 separately for reducing the height difference between the peripheral circuit 60 and the 3D memory unit 20, the aspect ratio of contact holes subsequently formed on the peripheral circuit 60 may be decreased, and that will be beneficial for forming interconnection structures between the peripheral circuit 60 and the 3D memory unit 20. In addition, the influence of the processes for forming the 3D memory unit 20, such as the influence of thermal treatments, plasma, and/or gases used in the processes, on the peripheral circuit 60 may be avoided because the 3D memory unit 20 is formed before the step of forming the peripheral circuit 60. The manufacturing yield, the electrical performance, and the reliability of the 3D memory structure may be enhanced accordingly. In some embodiments, the distance between the peripheral circuit 60 and the 3D memory unit 20 may be enlarged by the first insulation layer 30 for reducing plasma and/or gases diffused into the peripheral circuit 60, and the stress influence generated by deposition processes used in the step of forming the 3D memory unit 20 may be avoided because the peripheral circuit 60 is formed after the step of forming the 3D memory unit 20.

Figure 3:
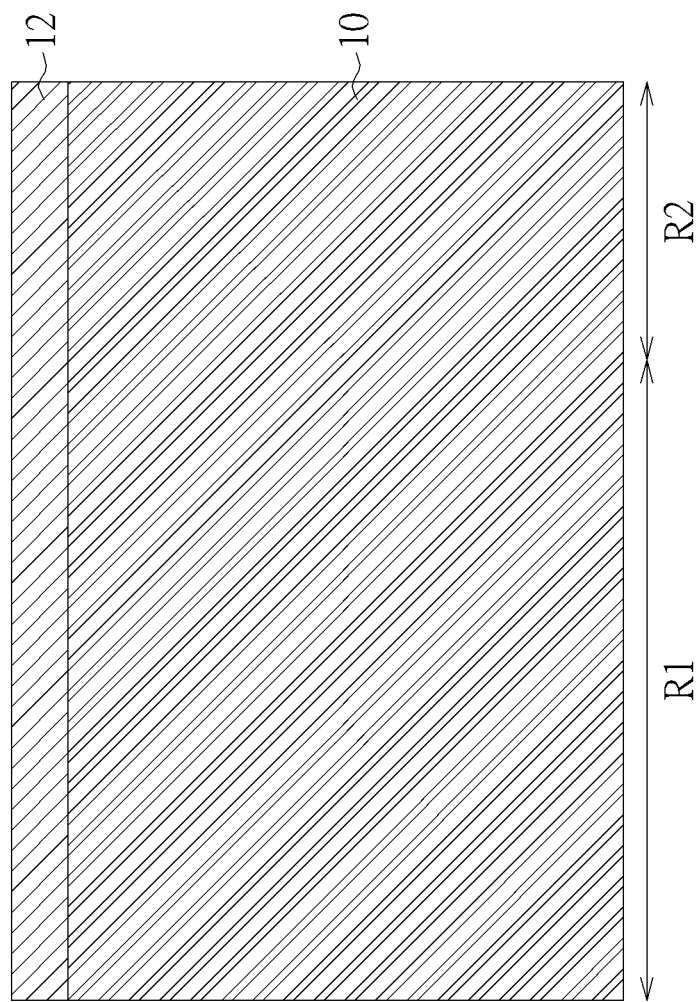
Figure 4:
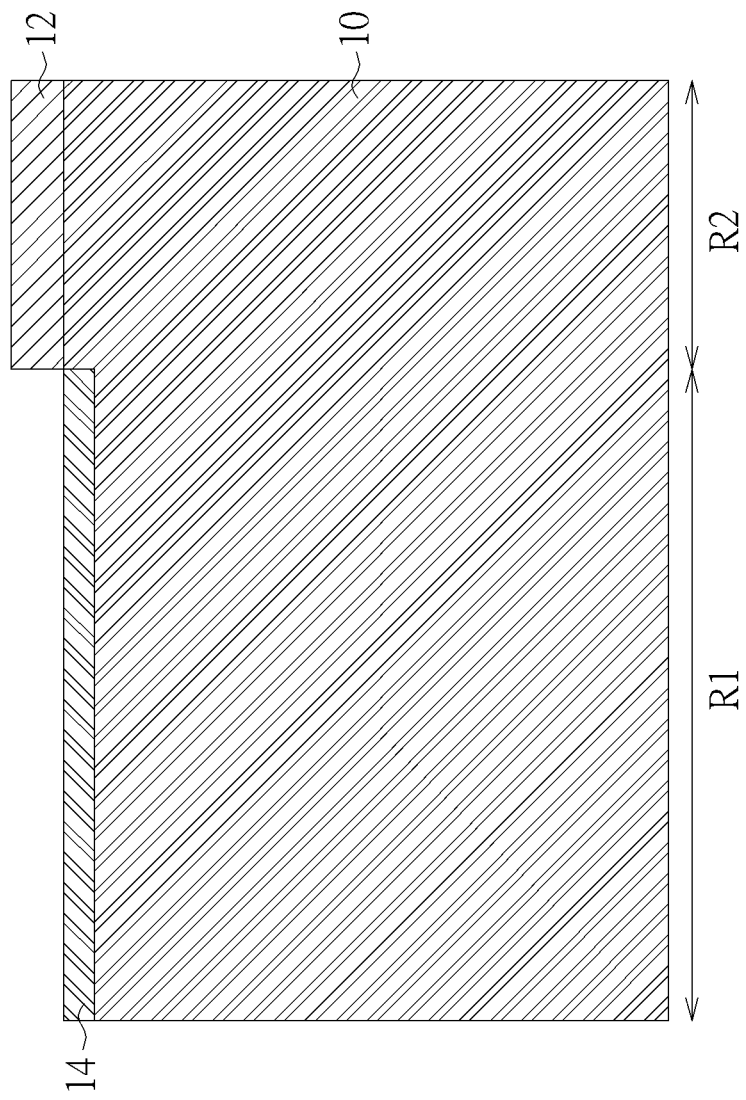

In some embodiments, the manufacturing method of the 3D memory structure may include but is not limited to the following steps. As shown in FIG. 3 and FIG. 11, in some embodiments, a field oxide layer 12 may be formed on the substrate 10 before forming the 3D memory unit 20, and the field oxide layer 12 may be formed on the first region R1 and the second region R2 of the substrate 10. The field oxide layer 12 may be used to reduce leakage current through the substrate 10 and/or leakage current on the surface of the substrate 10, especially for the peripheral circuit subsequently formed above the second region R2, but not limited thereto. In some embodiments, as shown in FIG. 3, FIG. 4, and FIG. 11, the field oxide layer 12 on the first region R1 may be removed before forming the 3D memory unit 20, and the field oxide layer 12 on the first region R1 may be removed by a chemical etch back (CEB) process or other suitable wet etching and/or dry etching processes, but not limited thereto. Additionally, in some embodiments, an oxide layer 14 may be formed on the first region R1 of the substrate 10 after the step of removing the field oxide layer 12 on the first region R1, and the oxide layer 14 may be regarded as a below select gate (BSG) oxide layer, but not limited thereto. In some embodiments, the thickness of the oxide layer 14 on the first region R1 may be less than the thickness of the field oxide layer 12 on the second region R2, but not limited thereto. The oxide layer 14 may be formed by a dip pen nanolithography (DPN) process for precisely controlling the formation of the oxide layer 14 on the first region R1, but not limited thereto.

Figure 5:
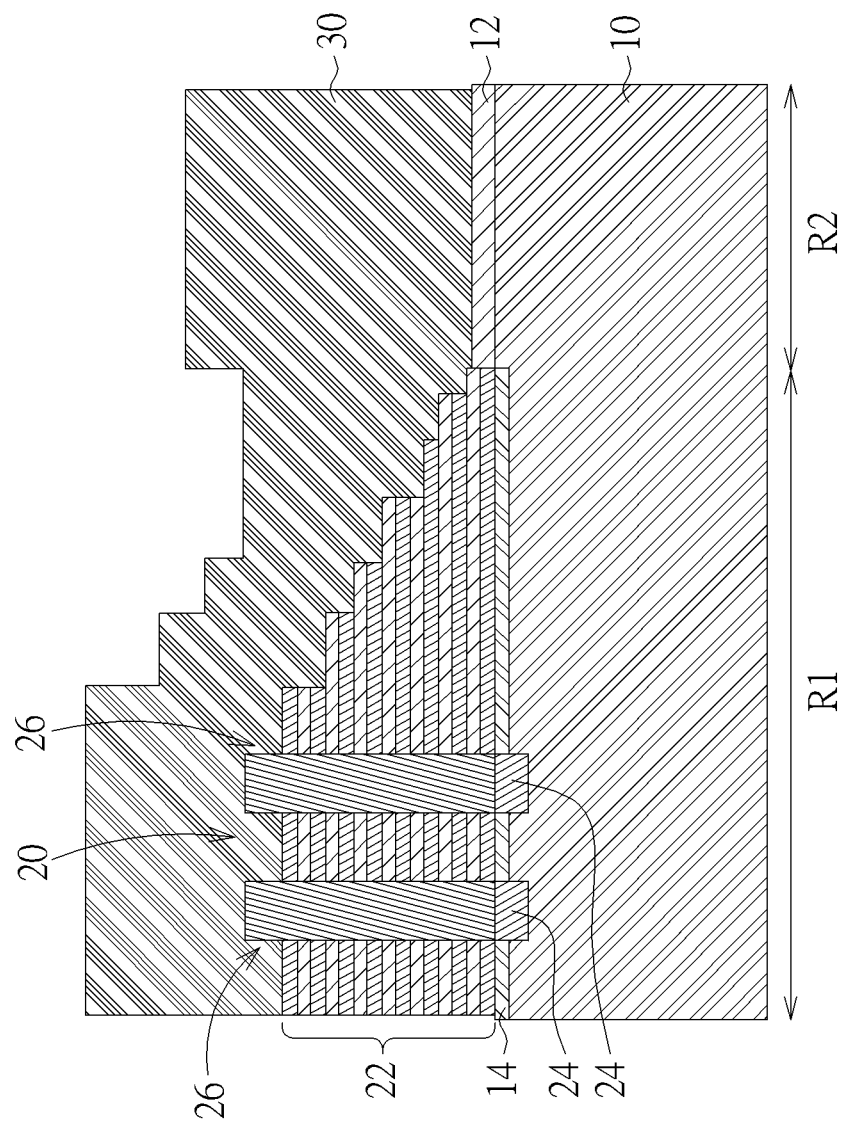

As shown in FIG. 5, the 3D memory unit 20 is formed on the first region R1 of the substrate 10. In some embodiments, the 3D memory unit 20 may be a 3D NAND memory unit including a memory stack 22, a plurality of epitaxial structures 24, and a plurality of memory strings 26, but not limited thereto. In some embodiments, the memory stack 22 may include conductor layers and dielectric layers disposed alternately in the vertical direction. The conductor layers in the memory stack 22 may include conductive materials including, but not limited to, tungsten (W), cobalt (Co), copper (Cu), aluminum (Al), doped silicon, silicides, or any combination thereof. The dielectric layers in the memory stack 22 may include dielectric materials including, but not limited to, silicon oxide, silicon nitride, silicon oxynitride, or any combination thereof. The memory stack 22 may include an inner region (also known as a "core array region") and an outer region (also known as a "staircase region"). In some embodiments, the inner region is the center region of memory stack 22 where array of memory strings 26 are formed, and the outer region is the remaining region of the memory stack 22 surrounding the inner region (including the sides and edges). In some embodiments, at least on one lateral side, the outer region of memory stack 22 may include a staircase structure. The edges of the conductor/dielectric layer pairs in the staircase structure of memory stack 22 along the vertical direction away from the substrate 10 may be staggered laterally toward the memory strings 26, but not limited thereto.

In some embodiments, each memory string 26 may extend vertically through the inner region of memory stack 22 and include a semiconductor channel and a dielectric layer (also known as a "memory film"). In some embodiments, the semiconductor channel in the memory string 26 may include silicon, such as amorphous silicon, polysilicon, or single crystalline silicon. In some embodiments, the memory film in the memory string 26 may be a composite layer including a tunneling layer, a storage layer (also known as a "charge trap/storage layer"), and a blocking layer, but not limited thereto. Each memory string 26 may have a cylinder shape (e.g., a pillar shape) penetrating the memory stack 22 in the vertical direction, and the epitaxial structure 24 may be disposed between the memory string 26 and the substrate 10 in the vertical direction. In some embodiments, the semiconductor channel, the tunneling layer, the storage layer, and the blocking layer in the memory string 26 may be arranged radially from the center toward the outer surface of the pillar in this order. The tunneling layer in the memory string 26 may include silicon oxide, silicon oxynitride, or any combination thereof. The storage layer in the memory string 26 may include silicon nitride, silicon oxynitride, silicon, or any combination thereof. The blocking layer in the memory string 26 may include silicon oxide, silicon oxynitride, high dielectric constant (high-k) dielectrics, or any combination thereof. For example, the memory film in the memory string 26 may be an oxide-nitride-oxide (ONO) structure, but not limited thereto. Additionally, in some embodiments, the memory string 26 may be formed by forming the materials mentioned above in a via hole, and a TEOS film may be formed after the step of forming the via hole for forming the oxide layer, but not limited thereto.

In some embodiments, the memory stack 22 may be formed by forming a gate replacement process. For example, a dielectric stack including a plurality of dielectric/sacrificial layer pairs stacked in the vertical direction may be formed on the substrate 10, and a staircase structure may be formed at an edge of the dielectric stack by performing a plurality of trim-etch cycles for the dielectric/sacrificial layer pairs toward the substrate 10. The dielectric layer and the sacrificial layer in the dielectric stack may include dielectric materials including, but not limited to, silicon oxide, silicon nitride, silicon oxynitride, or any combination thereof. The material composition of the dielectric layer may be different from the material composition of the sacrificial layer for providing the required etching selectivity in the step of forming the staircase structure. In some embodiments, the total numbers of the dielectric layers and the sacrificial layers in the dielectric stack may be 32 or 64, but not limited thereto. After the step of forming the staircase structure, the sacrificial layers in the dielectric stack may be removed and replaced by the conductor layers described above for forming the memory stack 22.

After the step of forming the 3D memory unit 20, the first insulation layer 30 is formed covering the 3D memory unit 20 and the second region R2 of the substrate 10. In some embodiments, a TEOS film (not shown) may be formed after the step of forming the 3D memory unit 20 and before the step of forming the first insulation layer 30, but not limited thereto. The first insulation layer 30 may be used to protect the 3D memory unit 20 from the subsequent process of forming the peripheral circuit.

Figure 6:
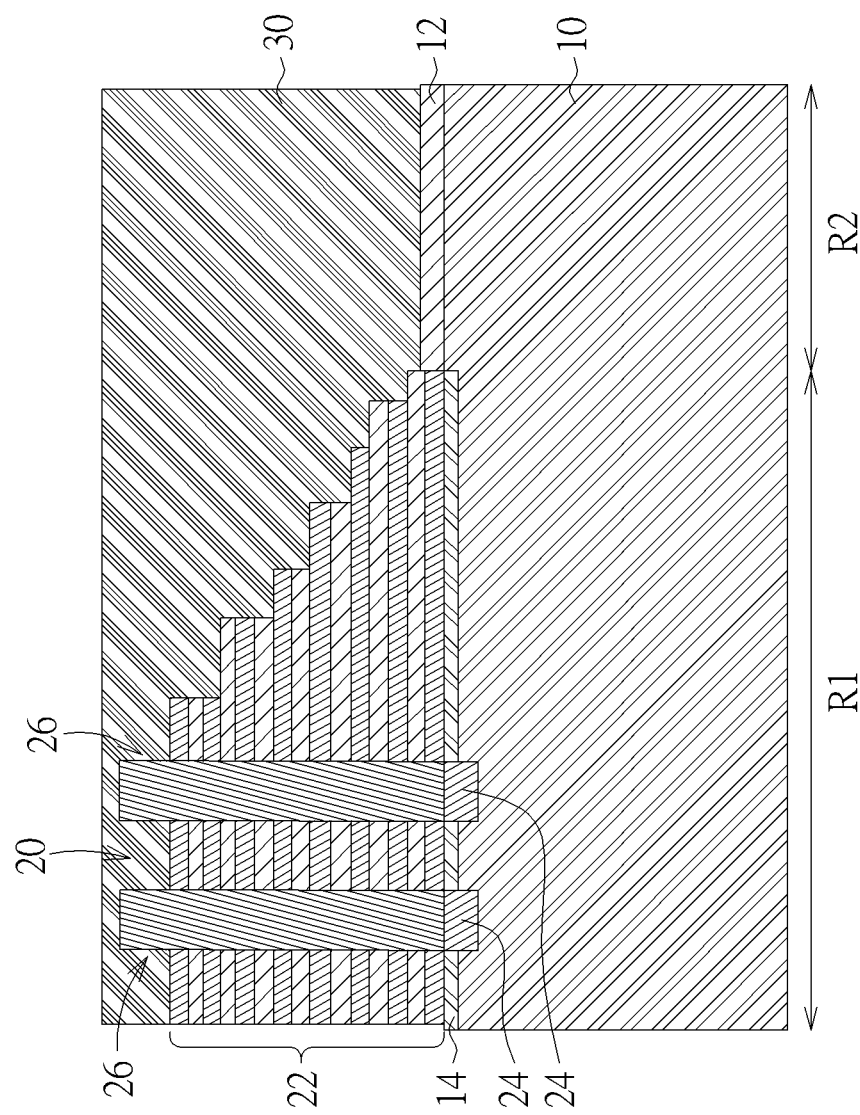

As shown in FIG. 5 and FIG. 6, the first planarization process is performed to the first insulation layer 30, and the top surface of the first insulation layer 30 on the first region R1 and the top surface of the first insulation layer 30 on the second region R1 may be nominally coplanar after the first planarization process.

Figure 7:
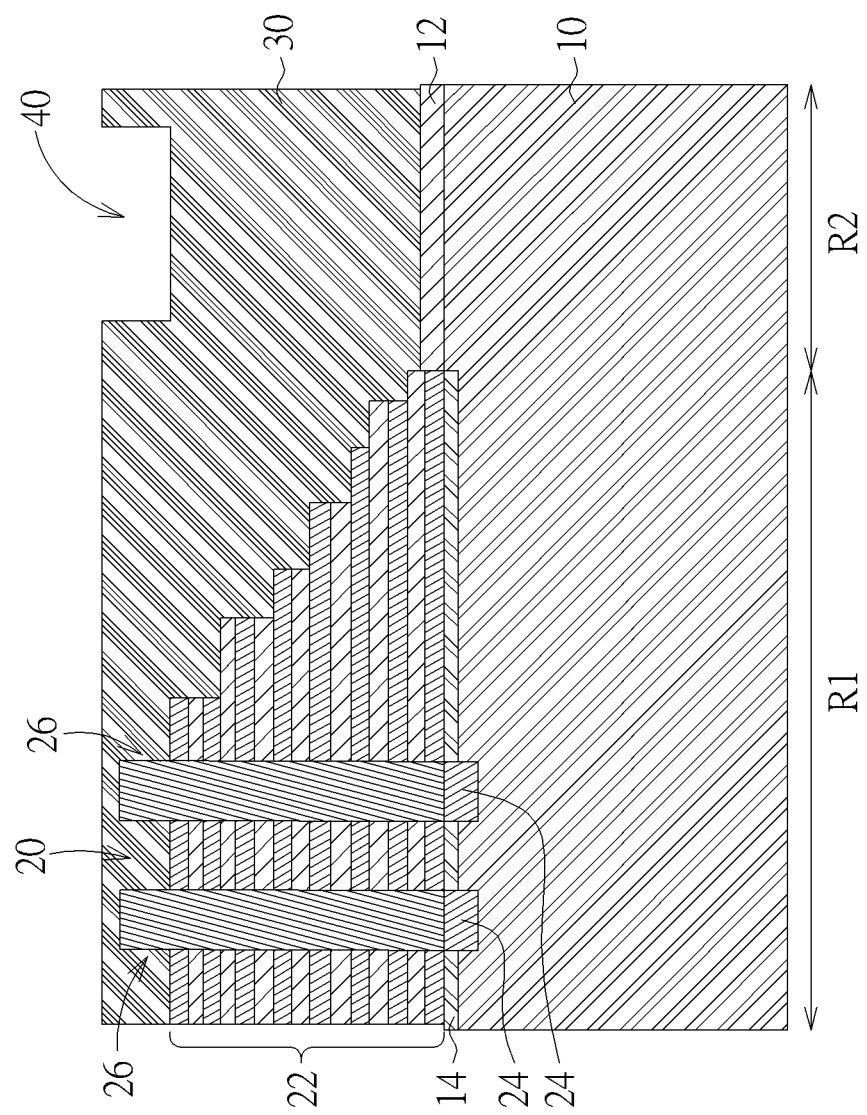
Figure 8:
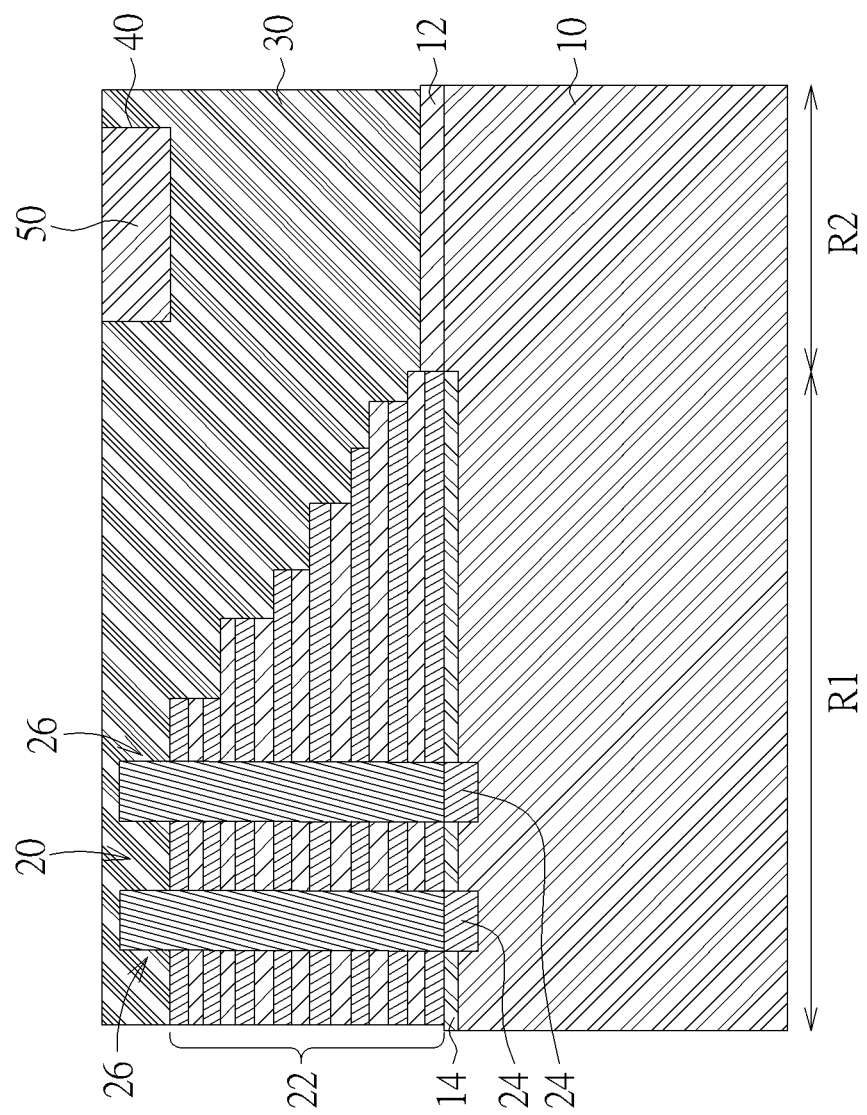

In some embodiments, forming the peripheral circuit 60 on the second region R2 may include but is not limited to the following steps. As shown in FIGS. 7-9, a semiconductor layer 50 may be formed on the first insulation layer 30 above the second region R2, and the peripheral circuit 60 may be formed on the semiconductor layer 50. The semiconductor layer 50 may include a silicon semiconductor layer, an oxide semiconductor layer, or other suitable semiconductor materials. The silicon semiconductor layer described above may include monocrystalline silicon, polysilicon, or other suitable semiconductor materials containing silicon. When the semiconductor layer 50 is a silicon semiconductor layer, the semiconductor layer 50 and a part of the first insulation layer 30 above the second region R2 may form a silicon-oninsulator (SOI) structure, and the SOI structure may be used to improve the electrical performance of the peripheral circuit 60 formed on the SOI structure, such as reducing the leakage current of the peripheral circuit 60 and/or enhancing clock rates of the peripheral circuit 60, but not limited thereto.

In some embodiments, a recess 40 may be formed in the first insulation layer 30 above the second region R2 before the step of forming the semiconductor layer 50, and the semiconductor layer 50 may be formed in the recess 40, but not limited thereto. In some embodiments, the recess 40 may be formed by a wet etching process and/or a dry etching process for removing a part of the first insulation layer 30 above the second region R2, and the recess 40 may be filled with the semiconductor layer 50. The first insulation layer 30 may be a silicon nitride layer preferably because silicon nitride has higher thermal conductivity, low corrosion rate in hydrofluoric acid solution, and good structural properties in comparison with silicon oxide, and the performance of the 3D memory structure under conditions such as high temperature and high power consumption may be enhanced by the SOI structure including silicon nitride. However, the first insulation layer 30 may be silicon oxide because of the convenient process of forming silicon oxide, and a silicon nitride layer may be formed in the recess 40 before the step of forming the semiconductor layer 50 for providing similar effects of the silicon nitride layer described above. The silicon nitride may be formed by a furnace process or other suitable film forming processes. It is worth noting that the top surface of the semiconductor layer 50 above the second region R2 is higher than or coplanar with the top surface of the first insulation layer 30 above the first region R1 preferably for reducing the height difference between the peripheral circuit 60 above the second region R2 and the 3D memory unit 20 above the first region R1, decreasing the aspect ratio of the contact holes, and lowering the difficulty in forming interconnection structures. In addition, in some embodiments, the bottom surface of the semiconductor layer 50 above the second region R2 may be lower than the top surface of the first insulation layer 30 above the first region R1 in the vertical direction, and the peripheral circuit 60 may not overlap the 3D memory unit 20 in the vertical direction preferably, but not limited thereto.

As shown in FIG. 10 and FIG. 11, an interconnection structure 80 between the 3D memory unit 20 and the peripheral circuit 60 may be formed for electrically connecting the 3D memory unit 20 and the peripheral circuit 60. In some embodiments, forming the interconnection structure 80 between the 3D memory unit 20 and the peripheral circuit 60 may include but is not limited to the following steps. As shown in FIG. 10, a second insulation layer 70 may be formed on the substrate 10 after forming the peripheral circuit 60, and the second insulation layer 70 may be formed on the first region R1 and the second region R2. In some embodiments, the second insulation layer 70 may be a single layer structure or a multiple layer structure of insulation materials, such as silicon oxide, silicon nitride, silicon oxynitride, silicon carbonitride, any suitable combination thereof, or other suitable insulation materials. The second insulation layer 70 may be formed by deposition processes, such as ALD, CVD, PVD, a combination thereof, or other suitable film forming processes. In some embodiments, the peripheral circuit 60 formed on the second region R2 may be covered by the second insulation layer 70. In some embodiments, a TEOS film (not shown) may be formed on the substrate 10 after the step of forming the peripheral circuit 60 and before the step of forming the second insulation layer 70, but not limited thereto. As shown in FIG. 10 and FIG. 11, the interconnection structure 80 may be formed after the step of forming the second insulation layer 70. In some embodiments, the interconnection structure 80 may include a first contact plug 82, a second contact plug 84, and a conductive layer 86. The first contact plug 82 may penetrate the second insulation layer 70 and the first insulation layer 30 above the first region R1 for being electrically connected with the 3D memory unit 20, the second contact plug 84 may penetrate the second insulation layer 70 above the second region R2 for being electrically connected with the peripheral circuit 60, and the conductive layer 86 may be formed on the second insulation layer 70 for electrically connecting the first contact plug 82 and the second contact plug 84, but not limited thereto. Therefore, the interconnection structure 80 may be partly formed in the second insulation layer 70 and partly formed on the insulation layer 70. The material of the interconnection structure 80 may include W, Co, Cu, Al, any combination thereof, or other suitable conductive materials.

As shown in FIG. 10, in some embodiments, the top surface of the second insulation layer 70 may be uneven because of the peripheral circuit 60 formed on the second region R2. Therefore, as shown in FIG. 10 and FIG. 11, a second planarization process may be performed to the second insulation layer 70 before forming the interconnection structure 80, and the second planarization process may be used to reduce the height difference between the second insulation layer 70 above the first region R1 and the second insulation layer 70 above the second region R2, but not limited thereto. In some embodiments, the top surface of the second insulation layer 70 above the first region R1 (such as the topmost surface of the second insulation layer 70 above the first region R1) and the top surface of the second insulation layer 70 above the second region R2 (such as the topmost surface of the second insulation layer 70 above the second region R2) may be nominally coplanar after the second planarization process. In some embodiments, the second planarization process may include a CMP process, an etching back process, or other suitable planarization approaches.

By the manufacturing method described above, a 3D memory structure 100 shown in FIG. 11 may be obtained. As shown in FIG. 11, the 3D memory structure 100 includes the substrate 10, the 3D memory unit 20, the first insulation layer 30, and the peripheral circuit 60. The first region R1 and the second region R2 are defined on the substrate 10. The 3D memory unit 20 is disposed on the first region R1 of the substrate 10. The first insulation layer 30 is disposed on the 3D memory unit 20 and the second region R2 of the substrate 10. The peripheral circuit 60 is disposed on the first insulation layer 30 above the second region R2. In some embodiments, the 3D memory structure 100 may further include the semiconductor layer 50 disposed on the first insulation layer 30 above the second region R2, and the peripheral circuit 60 may be disposed on the semiconductor layer 50, but not limited thereto. In some embodiments, the 3D memory structure 100 may further include the recess 40 disposed in the first insulation layer 30 above the second region R2, and the semiconductor layer 50 may be disposed in the recess 40, but not limited thereto. In some embodiments, the semiconductor layer 50 may be a silicon semiconductor layer, and the semiconductor layer 50 and a part of the first insulation layer 30 above the second region R2 may form a SOI structure. The peripheral circuit 60 may be formed on the SOI structure including the semiconductor layer 50, and the SOI structure may be used to improve the electrical performance of the peripheral circuit 60, such as reducing the leakage current of the peripheral circuit 60 and/or enhancing clock rates of the peripheral circuit 60, but not limited thereto. In some embodiments, the peripheral circuit 60 may not overlap the 3D memory unit 20 in the vertical direction preferably for reducing the influence of the 3D memory unit 20 and the connection structure formed thereon on the electrical performance of the peripheral circuit 60, but not limited thereto.

The following description will detail the different embodiments of the present disclosure. To simplify the description, identical components in each of the following embodiments are marked with identical symbols. For making it easier to understand the differences between the embodiments, the following description will detail the dissimilarities among different embodiments and the identical features will not be redundantly described.

Figure 12:
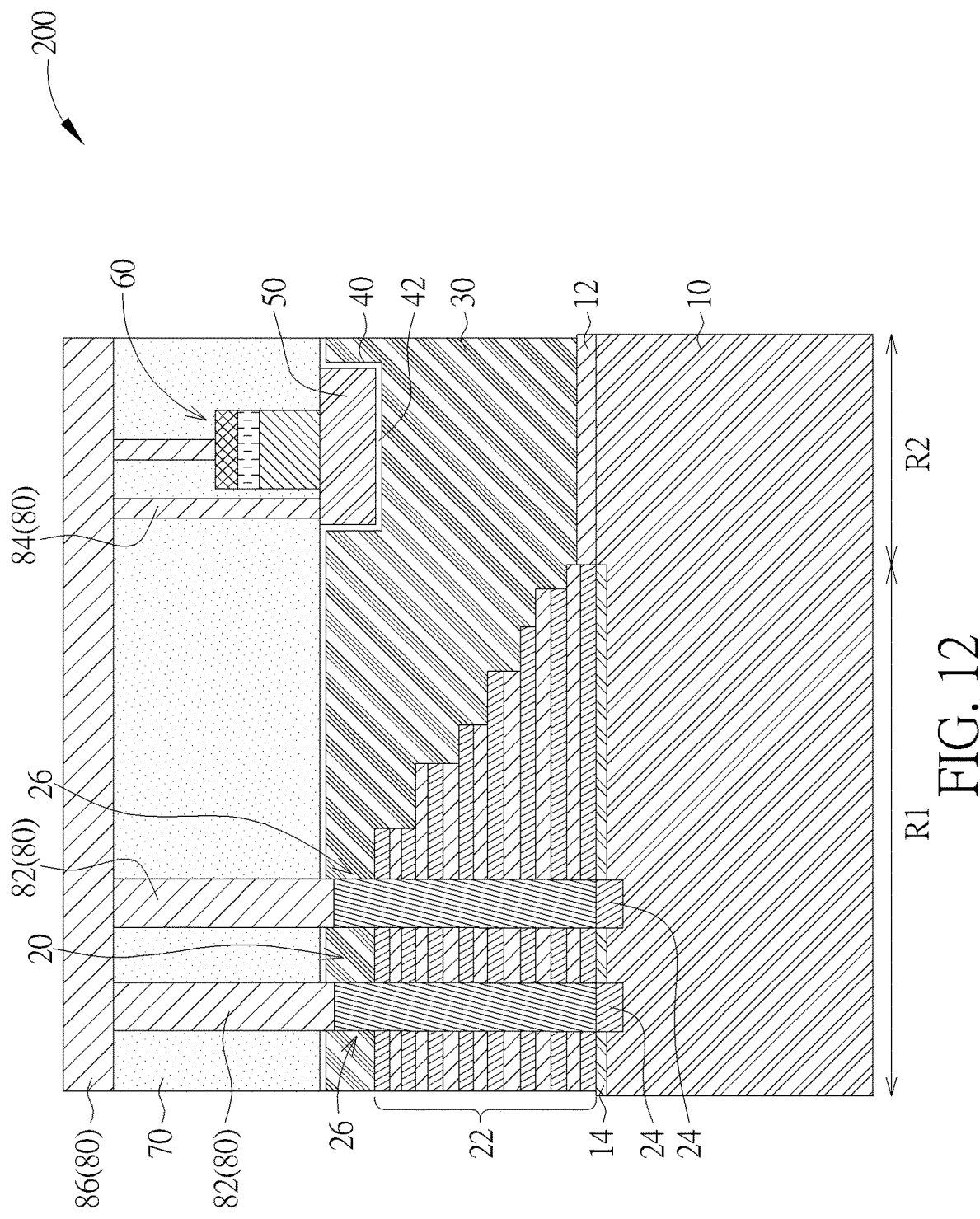
FIG. 12 is a schematic drawing illustrating a 3D memory structure according to a second embodiment of the present disclosure.

Please refer to FIG. 12. FIG. 12 is a schematic drawing illustrating a 3D memory structure 200 according to a second embodiment of the present disclosure. As shown in FIG. 12, the difference between the 3D memory structure 200 and the 3D memory structure in the first embodiment described above is that the 3D memory structure 200 may further include an insulation film 42 disposed in the recess 40, and the semiconductor layer 50 may be disposed on the insulation film 42 in the recess 40. In other words, in the manufacturing method of the 3D memory structure 200, the step of forming the peripheral circuit 60 on the second region R2 may further include forming the insulation film 42 in the recess 40 before forming the semiconductor layer 50, and the semiconductor layer 50 may be formed on the insulation film 42 in the recess 40. The insulation film 42 may include silicon nitride or other suitable insulation materials, and the material composition of the insulation film 42 may be different from the material composition of the first insulation layer 30. When the semiconductor layer 50 is a silicon semiconductor layer, the semiconductor layer 50 and the insulation film 42 in the recess may form an SOI structure, and the SOI structure may be used to improve the electrical performance of the peripheral circuit 60 formed on the SOI structure, such as reducing the leakage current of the peripheral circuit 60 and/or enhancing clock rates of the peripheral circuit 60, but not limited thereto. In some embodiments, the semiconductor layer 50, the insulation film 42, and a part of the first insulation layer 30 above the second region R2 may form an SOI structure, but not limited thereto. In some embodiments, the insulation film 42 may be further disposed on the first insulation layer 30 above the first region R1, and the interconnection structure 80 may further penetrate the insulation film 42 above the first region R1 for being electrically connected with the 3D memory unit 20 beneath the insulation film 42, but not limited thereto. In some embodiments, the top surface of the semiconductor layer 50 above the second region R2 may be higher than or nominally coplanar with the top surface of the insulation film 42 above the first region R1 preferably for reducing the height difference between the peripheral circuit 60 above the second region R2 and the 3D memory unit 20 above the first region R1, decreasing the aspect ratio of the contact holes formed above the 3D memory unit 20, and lowering the difficulty in forming the interconnection structure 80.

In some embodiments, a 3D memory device including the 3D memory structure in the present disclosure (such as the 3D memory structure 100 and the 3D memory structure 200 described above) may be provided. A package process may be performed to the 3D memory structure for forming the 3D memory device, and the 3D memory device may further include connectors, such as a SATA (serial advanced technology attachment) connector, an eSATA connector, a M.2 connector, or a PCI-E connector, for transmitting signals between the 3D memory structure and outer electrical units, but not limited thereto. The 3D memory device in the present disclosure may have advantages such as better electrical performance, higher manufacturing yield, higher reliability, and better process feasibility for forming interconnection structures because of the 3D memory structure detailed above. Additionally, in some embodiments, an electronic device including the 3D memory device may be provided. The electronic device may be a cell phone, a desktop PC, a tablet PC, a notebook PC, a server, or other devices capable of storing data. The electronic device in the present disclosure may also have the above-mentioned advantages because of the 3D memory structure detailed above.

To summarize the above descriptions, in the 3D memory structure and the manufacturing method thereof in the present disclosure, the peripheral circuit is formed on the substrate after the step of forming the 3D memory unit on the substrate, the step of forming the first insulation layer on the substrate and the 3D memory unit, and the planarization process performed to the first insulation layer. Therefore, the influence of the processes for forming the 3D memory unit, such as the influence of the thermal treatments, plasma, and/or gases used in the processes, on the peripheral circuit may be avoided. The manufacturing yield, the electrical performance, and the reliability of the 3D memory structure may be enhanced, and the difficulty in forming the interconnection structure between the 3D memory unit and the peripheral circuit may be lowered accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A three-dimensional (3D) memory structure, comprising:
   a substrate, wherein a first region and a second region are defined on the substrate;
   a 3D memory unit disposed on the first region of the substrate;
   a first insulation layer disposed on the 3D memory unit and the second region of the substrate;
   a peripheral circuit disposed on the first insulation layer above the second region; and
   a semiconductor layer disposed on the first insulation layer above the second region, wherein the peripheral circuit is disposed on the semiconductor layer.

2. The 3D memory structure according to claim 1, further comprising:
   a recess disposed in the first insulation layer above the second region, wherein the semiconductor layer is disposed in the recess.

3. The 3D memory structure according to claim 2, further comprising:
   an insulation film disposed in the recess, wherein the semiconductor layer is disposed on the insulation film in the recess.

4. The 3D memory structure according to claim 3, wherein the top surface of the semiconductor layer above the second region is higher than or coplanar with the top surface of the first insulation layer above the first region.

5. The 3D memory structure according to claim 1, wherein the semiconductor layer comprises a silicon semiconductor layer, and the semiconductor layer and a part of the first insulation layer above the second region form a silicon-on-insulator (SOI) structure.

6. The 3D memory structure according to claim 1, wherein the 3D memory unit comprises a 3D NAND memory unit, a 3D NOR memory unit, a DRAM unit, or a 3D XPoint memory unit.

7. The 3D memory structure according to claim 1, wherein the first region comprises a core device region, and the second region comprises a peripheral circuit region.

8. A 3D memory device, comprising the 3D memory structure of claim 1 and a connector configured to transmit signals between the 3D memory structure and outer electrical units.

9. An electronic device, comprising the 3D memory device of claim 8, wherein the electronic device is a cell phone, a desktop PC, a tablet PC, a notebook PC, or a server.

\* \* \* \* \*